(12) United States Patent
Kitazume et al.

(10) Patent No.: US 10,971,666 B2
(45) Date of Patent: *Apr. 6, 2021

(54) METHOD FOR MANUFACTURING AN OPTICAL MODULE AND OPTICAL MODULE (71) Applicant: MITSUMI ELECTRIC CO., LTD., Tokyo (JP)

(72) Inventors: Makoto Kitazume, Tokyo (JP); Tadashi Ono, Tokyo (JP); Toshiki Komiyama, Tokyo (JP); Yuki Inugai, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 27 days.

This patent is subject to a terminal disclaimer.

(21) Appl. No.: 16/484,189

(22) PCT Filed: Feb. 28, 2018

(86) PCT No.: PCT/JP2018/007574
§ 371 (c)(1),
(2) Date: Aug. 7, 2019

(87) PCT Pub. No.: WO2018/168473
PCT Pub. Date: Sep. 20, 2018

(65) Prior Publication Data
US 2019/0355887 A1 Nov. 21, 2019

(30) Foreign Application Priority Data
Mar. 15, 2017 (JP) .............................. JP2017-049732

(51) Int. Cl.
*H01L 33/52* (2010.01)
*H01L 33/60* (2010.01)
(Continued)

(52) U.S. Cl.
CPC ............ *H01L 33/60* (2013.01); *H01L 21/563* (2013.01); *H01L 23/3121* (2013.01);
(Continued)

(58) Field of Classification Search
CPC ... H01L 21/563; H01L 23/293; H01L 23/295; H01L 23/3107; H01L 23/3121;
(Continued)

(56) References Cited

U.S. PATENT DOCUMENTS 8,753,907 B2   6/2014 Shimomura et al.
10,714,360 B2* 7/2020 Ono ...................... H01L 23/29
(Continued)

FOREIGN PATENT DOCUMENTS

JP    2005-070082    3/2005
JP    2008-071806    3/2008
(Continued)

OTHER PUBLICATIONS

International Search Report for PCT/JP2018/007574 dated May 1, 2018.

*Primary Examiner* — Stephen W Smoot
(74) *Attorney, Agent, or Firm* — IPUSA, PLLC (57) ABSTRACT

A method includes mounting a light emitting device on a board having electrodes on its surface, disposing a resin sheet containing a light conversion material so as to face the surface of the board and filling a space between the resin sheet and the board with a first light transmissive resin, covering a surface of the resin sheet opposite to a surface of the resin sheet covered with the first light transmissive resin, with a second light transmissive resin, forming a groove extending from a top surface of the second light transmissive resin to the board, filling the groove with light reflective resin and covering the top surface of the second light transmissive resin with the light reflective resin, removing (Continued)

the light reflective resin, and dicing the light emitting device by cutting along the light reflective resin.

12 Claims, 7 Drawing Sheets

(51) Int. Cl.
| | |
|---|---|
| *H01L 25/075* | (2006.01) |
| *H01L 33/50* | (2010.01) |
| *H01L 33/56* | (2010.01) |
| *H01L 33/62* | (2010.01) |
| *H01L 23/31* | (2006.01) |
| *H01L 33/46* | (2010.01) |
| *H01L 21/56* | (2006.01) |

(52) U.S. Cl.
CPC ...... *H01L 23/3135* (2013.01); *H01L 25/0753* (2013.01); *H01L 33/46* (2013.01); *H01L 33/507* (2013.01); *H01L 33/52* (2013.01); *H01L 33/56* (2013.01); *H01L 33/62* (2013.01); *H01L 2933/005* (2013.01); *H01L 2933/0041* (2013.01); *H01L 2933/0058* (2013.01); *H01L 2933/0066* (2013.01)

(58) Field of Classification Search
CPC ............. H01L 23/3128; H01L 23/3135; H01L 23/3185; H01L 25/0753; H01L 33/005; H01L 33/46; H01L 33/50; H01L 33/505; H01L 33/507; H01L 33/52; H01L 33/54; H01L 33/56; H01L 33/60; H01L 2933/0041; H01L 2933/005; H01L 2933/0058; H01L 2933/0066
See application file for complete search history.

(56) References Cited

U.S. PATENT DOCUMENTS

| | | |
|---|---|---|
| 2010/0258830 A1 | 10/2010 | Ide et al. |
| 2011/0108875 A1 | 5/2011 | Takenaka et al. |
| 2011/0272716 A1 | 11/2011 | Lee et al. |
| 2013/0299796 A1 | 11/2013 | Masuyama et al. |
| 2014/0306213 A1 | 10/2014 | Sato et al. |
| 2015/0014820 A1 | 1/2015 | Owada |
| 2015/0162511 A1 | 6/2015 | Washizu |
| 2015/0179901 A1 | 6/2015 | Ok et al. |
| 2015/0359056 A1* | 12/2015 | Song ............ H01L 33/58 315/186 |
| 2016/0011689 A1 | 1/2016 | Kim et al. |
| 2016/0276293 A1* | 9/2016 | Hung ............ H01L 23/60 |
| 2016/0337561 A1 | 11/2016 | Park et al. |
| 2017/0011670 A1* | 1/2017 | van de Ven ............ G09F 13/04 |
| 2017/0345767 A1 | 11/2017 | Watanabe |
| 2017/0357113 A1 | 12/2017 | Yamazaki et al. |
| 2018/0175265 A1* | 6/2018 | Kim ............ H01L 33/504 |
| 2018/0223061 A1 | 8/2018 | Hattori et al. |
| 2018/0286829 A1 | 10/2018 | Akaike et al. |
| 2018/0309073 A1 | 10/2018 | Nakamura et al. |

FOREIGN PATENT DOCUMENTS

| | | |
|---|---|---|
| JP | 2010-010279 | 1/2010 |
| JP | 2011-238928 | 11/2011 |
| JP | 2012-069577 | 4/2012 |
| JP | 2013-004807 | 1/2013 |
| JP | 2013-077679 | 4/2013 |
| WO | 2009/066430 | 5/2009 |
| WO | 2014/017108 | 1/2014 |
| WO | 2016/052025 | 4/2016 |
| WO | 2016/088522 | 6/2016 |
| WO | 2016/152562 | 9/2016 |

* cited by examiner

METHOD FOR MANUFACTURING AN OPTICAL MODULE AND OPTICAL MODULE

TECHNICAL FIELD

The present invention relates to a method for manufacturing an optical module and an optical module.

BACKGROUND ART

Conventionally, a method for manufacturing a semiconductor light emitting device is known that includes a first frame to which a light emitting device is attached, a second frame spaced apart from the first frame and connected to an electrode of the light emitting device via a metal wire, and a resin package covering the light emitting device and the first frame and the second frame (for example, see Patent Document 1).

In the method for manufacturing the semiconductor light emitting device described in Patent Document 1, a light emitting device, and a first resin covering a first frame and a second frame are formed first on the surface of a metal plate having a plurality of first frames and a plurality of second frames alternately disposed thereon, and a sacrificial sheet is attached to the surface of the first resin. Then, a groove is formed in the first resin and the sacrificial sheet on the metal plate along the outer periphery of the resin package; the groove is filled with second resin; and the second resin is cut along the groove to form a resin package having the outer periphery of the first resin covered with the second resin. Thereafter, an adhesive sheet having greater adhesive strength than the sacrificial sheet is adhered to the second resin covering the top surface, and the adhesive sheet is peeled off from the resin package, thereby removing the second resin formed on the top surface of the first resin together with the sacrificial sheet. Thus, the light emitting surface is exposed, and the semiconductor light emitting device is completed.

PRIOR ART DOCUMENTS

Patent Documents

Patent Document 1: Japanese Laid-Open Patent Application Publication No. 2013-4807

SUMMARY OF THE INVENTION

Problem to be Solved by the Invention

However, the method for manufacturing the semiconductor light emitting device disclosed in Patent Document 1 includes a step of attaching the sacrificial sheet that is ultimately removed from the surface of the first resin. Such sacrificial sheets increase manufacturing costs because the sacrifice sheets are unnecessary materials for the product.

Further, in the method of manufacturing the semiconductor light emitting device, dicing is performed once when forming the groove in the first resin, and dicing is performed once again when cutting the second resin along the groove, which means that a total of two half-cuts are performed. The multiple half-cuts by dicing in this manner become a factor that complicates the manufacturing process.

Accordingly, the present invention is intended to provide a method for manufacturing an optical module and an optical module that can achieve a reduction in height and size of the module while shortening a process.

Means for Solving the Problem

In order to achieve the above purpose, a method for manufacturing an optical module according to an embodiment of the present invention includes:

a step of mounting a light emitting device on a board having a plurality of electrodes on its surface in a facedown manner;

a step of disposing a resin sheet containing a light conversion material so as to face the surface on which the light emitting device is mounted of the board and filling a space between the resin sheet and the board including the resin sheet and the light emitting device with a first light transmissive resin;

a step of covering a surface of the resin sheet opposite to a surface of the resin sheet covered with the first light transmissive resin, with a second light transmissive resin;

a step of forming a groove extending from a top surface of the second light transmissive resin to a predetermined depth of the board;

a step of filling the groove with light reflective resin and covering the top surface of the second light transmissive resin with the light reflective resin;

a step of removing the light reflective resin on the second light transmissive resin; and a step of dicing the light emitting device by cutting along the light reflective resin such that an outer lateral surface is covered with the light reflective resin by leaving part of the light reflective resin filled in the groove.

A method for manufacturing an optical module according another embodiment of the present invention includes:

a step of mounting a light emitting device on a board having a plurality of electrodes on its surface in a facedown manner;

a step of sealing the surface of the board including lateral faces, a top face, and a lower face of the light emitting device with a first light transmissive resin mixed with a light wavelength conversion material;

a step of covering a top surface of the first light transmissive resin with a second light transmissive resin;

a step of forming a groove extending from a top surface of the second light transmissive resin to a predetermined depth of the board;

a step of filling the groove with light reflective resin and covering the top surface of the second light transmissive resin with the light reflective resin;

a step of removing the light reflective resin on the second light transmissive resin; and a step of dicing the light emitting device by cutting along the light reflective resin such that outer peripheral lateral surface is covered with the light reflective resin by leaving part of the light reflective resin filled in the groove.

An optical module according to another embodiment of the present invention includes:

a board having a plurality of electrodes on its surface;

a light emitting device mounted on the plurality of electrodes of the board in a facedown manner;

a resin sheet containing a light wavelength conversion material provided above the light emitting device;

a first light transmissive resin sealing a space between the board and the resin sheet including a space between the light emitting device and the resin sheet;

a second light transmissive resin covering a face of the resin sheet opposite to the face of the resin sheet sealed with the first light transmissive resin; and a light reflective resin containing a light reflective material provided to cover an outer peripheral lateral surface along the outer peripheral lateral surface of a stack constituted of the board, the light emitting device, the resin sheet, the first light transmissive resin and the second light transmissive resin.

An optical module according to another embodiment of the present invention includes:

a board having a plurality of electrodes on its surface;

a light emitting device mounted on the plurality of electrodes of the board in a facedown manner;

a first light transmissive resin mixed with a light wavelength conversion material and sealing the surface of the board including the light emitting device;

a second light transmissive resin covering a top surface of the first light transmissive resin;

a light reflective resin containing a light reflective material provided to cover an outer peripheral lateral surface along the outer peripheral lateral surface of a stack constituted of the board, the light emitting device, the resin sheet, the first light transmissive resin and the second light transmissive resin.

An optical module according to another embodiment of the present invention includes:

a board having a rectangular shape in a plan view and including a plurality of electrodes on its top surface and a plurality of external connection terminals on its back surface;

a light emitting device mounted on the plurality of electrodes of the board along a lengthwise direction of the rectangular shape in a facedown manner; and a light transmissive resin sealing the top surface of the board including the plurality of light emitting devices, wherein the plurality of light emitting devices includes a plurality of groups of a predetermined number of light emitting devices electrically connected in series.

Advantageous Effect of the Invention

According to the present invention, a module can be reduced in height and size while shortening a process.

EMBODIMENTS FOR CARRYING OUT THE INVENTION

Hereinafter, embodiments for carrying out the present invention will be described with reference to the drawings.

First Embodiment

Figure 1:
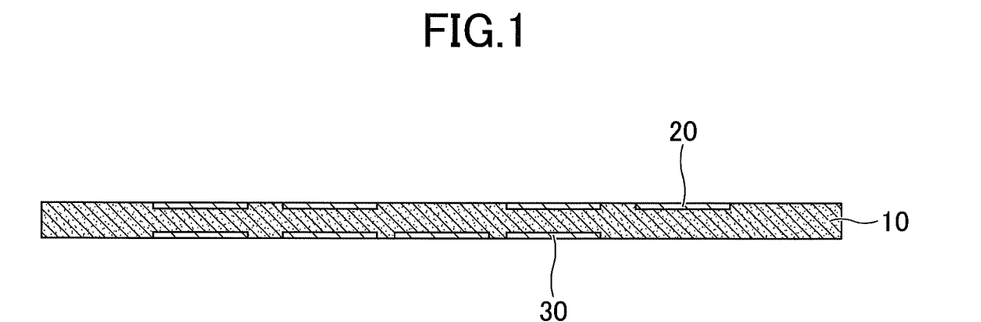
FIG. 1 is a diagram illustrating an example of a board preparation process of a method for manufacturing an optical module according to a first embodiment of the present invention.

FIG. 1 is a diagram illustrating an example of a board preparation process of a method for manufacturing an optical module according to a first embodiment of the present invention. In the board preparation process, a printed circuit board 10 is provided for mounting an LED (Light Emitting Diode) chip. The printed circuit board 10 is an example of a board for mounting the LED chip, and another board may be used if the LED chip can be mounted thereon. In the present embodiment, an example of using a printed circuit board 10 as a board will be described. The printed circuit board 10 may, for example, be formed into a rectangular shape in a plan view.

The printed circuit board 10 includes an electrode 20 on its surface for mounting the LED chip, and an external connection terminal 30 on its back surface for providing an electrical connection to the motherboard. Multiple electrodes 20 and external connection terminals 30 are provided. Because the mounting LED chip typically includes two terminals, that is an anode and a cathode, the multiple electrodes 20 and the multiple external connection terminals 30 are both provided. Because a plurality of LED chips is typically mounted on the surface of the printed circuit board 10, the number of electrodes 20 and external connection terminals 30 is determined in accordance with the number of LED chips to be mounted.

The electrodes 20 on the top surface side and the external connection terminals 30 on the back surface side are connected to each other by a connection pattern inside the printed circuit board 10. Details of these points will be described later.

In the board preparation process, in addition to preparing the printed circuit board 10, the printed circuit board 10 is cleaned in order to remove foreign matter adhered to the printed circuit board 10. After the cleaning, the printed circuit board 10 is dried by baking.

Figure 2:
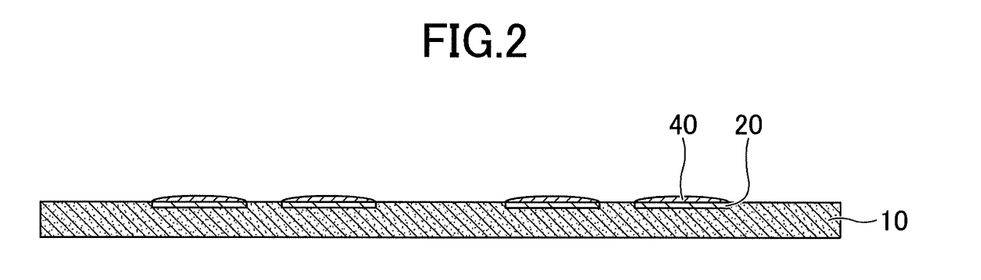
FIG. 2 is a diagram illustrating an example of a bonding paste application process of a method for manufacturing an optical module according to a first embodiment of the present invention.

FIG. 2 is a diagram illustrating an example of a bonding paste application process of the method for manufacturing an optical module according to the first embodiment of the present invention. Because the external connection terminals 30 are not directly related to the method for manufacturing the optical module, the depiction is omitted in FIG. 2 and the following figures. The external connection terminals 30 will be described in detail when describing the internal structure of the printed circuit board 10.

In the bonding paste application process, a bonding paste 40 is applied to the electrodes 20 provided on the surface of the printed circuit board 10. A variety of bonding pastes 40 may be used as long as the electrodes of the LED chip and the electrodes 20 on the top surface of the printed circuit board 10 can be bonded and electrically connected by heat melting. The bonding paste 40 may be, for example, an Au—Sn (gold-tin) paste. After the bonding paste 40 is applied to the surface of the electrode 20, the bonding paste 40 is melted by heating and then cooled down. After the cooling, remaining flux is removed by washing. Due to the bonding paste application process, the LED chips are ready to be mounted on the electrodes 20.

Figure 3:
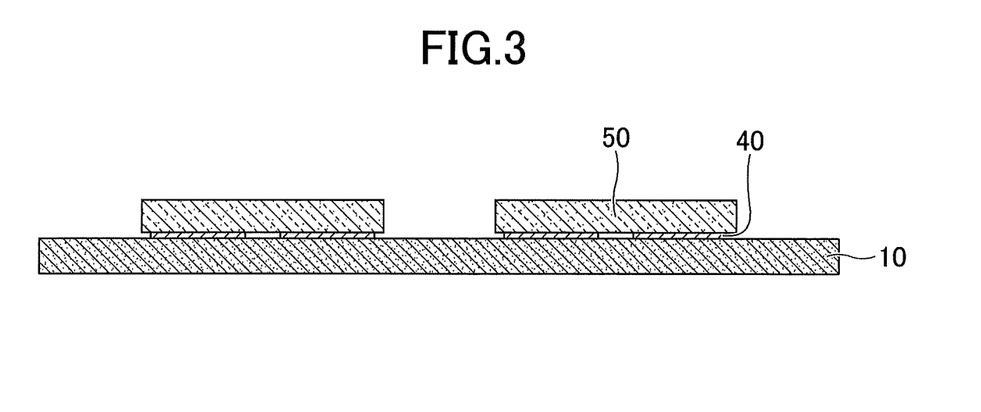
FIG. 3 is a diagram illustrating an example of a mounting process of a method for manufacturing an optical module according to a first embodiment of the present invention.

FIG. 3 is a diagram illustrating an example of a mounting process of the method for manufacturing the optical module according to the first embodiment of the present invention. In the mounting process, an LED chip 50 separated from a wafer is mounted to the printed circuit board 10. The LED chip 50 is an example of the light emitting device. As long as a device can emit light, another device may be mounted. In the present embodiment, an example of using the LED chip 50 as the light emitting device will be described.

The LED chips 50 are mounted on the printed circuit board 10 in a face-down manner. That is, the terminals (or electrodes) of the LED chips are placed on the lower side and directly bonded to the electrodes 20 via the bonding paste 40 without using bonding wires. Such flip-chip mounting makes the bonding wires unnecessary and implements low protrusion mounting.

The LED chips 50 are typically mounted on the electrodes 20 by a thermal compression bonding method. However, the mounting method of the LED chips is not limited thereto as long as the flip-chip mounting is possible, and various mounting methods may be used. The thermal compression bonding method is a method of crimping the LED chip 50 to the board 10 (precisely, the electrode 20) using a crimping head or the like while heating.

The LED chip 50 has a light emitting surface opposite to the printed circuit board 10, and in the example of FIG. 3, the top surface as the light emitting surface. That is, the surfaces opposite the terminal (or electrode) of the LED chips 50 are the light emitting surface, and in the example of FIG. 3, light is emitted upward.

Figure 4:
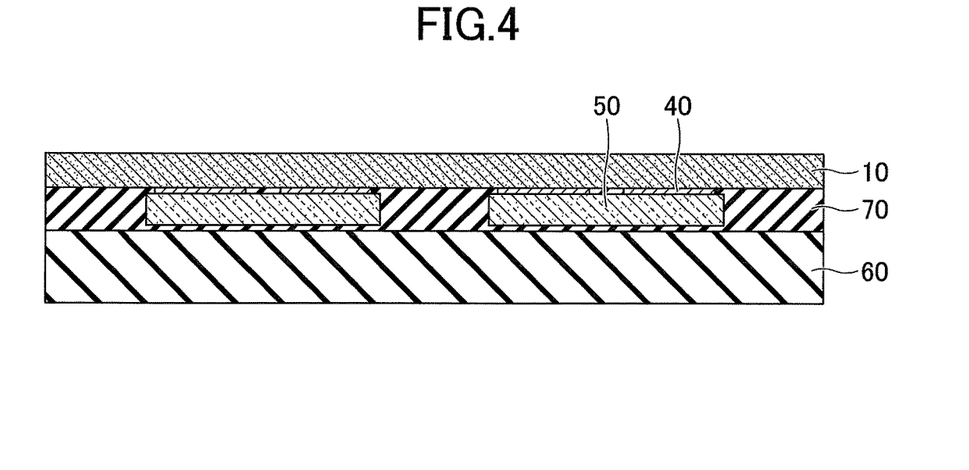
FIG. 4 is a diagram illustrating an example of a sealing process of a method for manufacturing an optical module according to a first embodiment of the present invention.

FIG. 4 is a diagram illustrating an example of a sealing process of the method for manufacturing the optical module according to the first embodiment of the present invention. In the sealing process, the mounting surface of the printed circuit board 10 on which the LED chip 50 is mounted is disposed to face a resin sheet 60 containing a light wavelength conversion material, and the space between the printed circuit board 10 and the resin sheet 60 containing the light wavelength conversion material is sealed with silicone resin 70. As illustrated in FIG. 4, the upper and lower surfaces of the LED chip 50 are inverted from the position in FIG. 3, and the light emitting surface of the LED chip 50 is positioned at a lower surface.

Here, the light wavelength conversion material in the resin sheet 60 containing the light wavelength conversion material may include, for example, the material necessary to convert the light in the LED chip 50 emitting blue light into white light. For example, white light can be obtained using Yttrium Aluminum Garnet as a light wavelength conversion material. In order to obtain white light, a chip of red, green, and blue light emitting diodes, which are the three primary colors of light, may be used without using a light wavelength conversion material to obtain white light as a single light emitting source. In addition, light of colors other than white light can be obtained by combining the emitting color of the LED chip with the light wavelength conversion material. Also, by coating the emitting surface of the LED chip with the light wavelength conversion material, light of the desired color can be obtained without using a resin sheet containing the light wavelength conversion material.

The silicone resin 70 is a thermosetting resin and can form a transparent material when cured. It should be noted that the silicone resin 70 is an example, and another resin may be used if the transparent material that transmits light when cured can be formed.

The sealing process may be implemented by various sealing methods if the space between the opposing printed circuit board 10 and the resin sheet 60 containing the light wavelength conversion material can be sealed including the LED chips 50. Hereinafter, an example of the sealing process will be described.

First, the resin sheet 60 containing the light wavelength conversion material is placed in a sealing mold, and the silicone resin 70 covers the entire top surface of the resin sheet 60 containing the light wavelength conversion material. That is, the silicone resin 70 is applied to the top surface of the resin sheet 60 containing the light wavelength conversion material. The LED chips 50 are then sealed with the silicone resin 70 and the resin sheet 60 containing the light wavelength conversion material by using a sealing device. That is, the space between the mounting surface of the printed circuit board 10 and the resin sheet 60 containing the light wavelength conversion material is filled with the silicone resin 70, and the printed circuit board 10, the LED chip 50 and the resin sheet 60 containing the light wavelength conversion material are sealed together. The sealing method is not particularly limited, and a compression mold method, a transfer mold method or the like may be used depending on the intended use.

The compression mold method is a molding method in which weighed silicone resin 70 is placed in a cavity of a heated mold and pressurized by a compression molding machine to harden. In the transfer mold method, the preheated silicone resin 70 is placed in a heating chamber called a transfer chamber, softened, pressed into a metal mold with an auxiliary ram (plunger), and retained, and a molded body is taken after the silicone resin 70 hardens.

As in the example above, applying the silicone resin 70 to the top surface of the resin sheet 60 containing the light wavelength conversion material goes into the same state as a state of applying an adhesive on the top surface of the resin sheet 60 containing the light wavelength conversion material. That is, the silicone resin 70 functions as a sealant as well as an adhesive. Thus, a space between the upper surface of the resin sheet 60 containing the light wavelength conversion material and the lower surface (light emitting surface) of the LED chip 50 is sealed with the thin silicone resin 70 that serves as an adhesive layer. Accordingly, in this case, the opposite surfaces of the LED chip 50 and the resin sheet 60 containing the light wavelength conversion material are disposed apart from each other with a small amount of space that is sealed with the adhesive layer. This enables the optical module to be formed low and downsized.

However, because the silicone resin 70 serves as a sealing material, the sealing is possible even when the LED chip 50 and the resin sheet 60 containing the light wavelength conversion material are substantially spaced apart from each other. Thus, the space between the LED chip 50 and the resin sheet 60 containing the optical wavelength conversion material can be set to an appropriate distance depending on the intended use.

In the above example, the silicone resin 70 is applied to the top surface of the resin sheet 60 containing the light wavelength conversion material, and the LED chip 50 is disposed thereon. However, it is possible to dispose the resin sheet 60 containing the light wavelength conversion material so as to face the mounting surface of the printed circuit board 10 from the beginning, and to seal the space between the resin sheet 70 and the mounting surface of the printed circuit board 10 by injecting the silicone resin 70 to the space. Thus, the sealing process may be implemented by a variety of methods.

Figure 5:
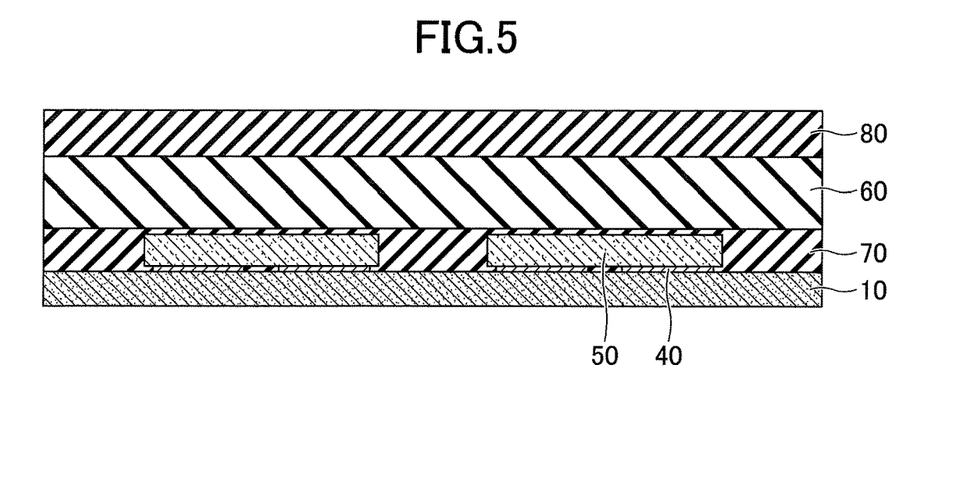
FIG. 5 is a diagram illustrating an example of a transparent resin coating process of a method for manufacturing an optical module according to a first embodiment the present invention.

FIG. 5 is a diagram illustrating an example of a transparent resin coating process of the method for manufacturing the optical module according to the first embodiment of the present invention. In the transparent resin coating process, the surface of the resin sheet 60 containing the light wavelength conversion material opposite to the sealing surface is covered with silicone resin 80. As illustrated in FIG. 5, the top and bottom of the example of FIG. 4 are inverted, and the top surface of the resin sheet 60 containing the light wavelength conversion material becomes an exposed surface when the printed circuit board 10 is positioned at the bottom and the resin sheet 60 containing the light wavelength conversion material is positioned at the top. The top surface of the resin sheet 60 containing the light wavelength conversion material is then covered with silicone resin 80. As described above, silicone resin 80 is resin that constitutes a transparent body that transmits light when it is thermally hardened, and resin other than silicone resin 80 may be used if the resin has such properties. The silicone resin 80 may be a resin exactly the same as the silicone resin 70 (the same product) used for sealing the space between the printed circuit board 10 and the resin sheet 60 containing the light wavelength conversion material, or a different resin (different product).

The silicone resin 80 serves to protect the resin sheet 60 containing the light wavelength conversion material. That is, the silicone resin 80 covers the exposed resin sheet 60 containing the light wavelength conversion material and protects the exposed surface of the resin sheet 60 containing the light wavelength conversion material without blocking the light.

The method of forming the silicone resin 80 is not particularly limited, and the above-described compression mold method or transfer mold method may be used, or it may be formed by potting, printing, or the like. The potting is a resin-filled coating.

As illustrated in FIG. 5, light emitted from the LED chip 50 will be emitted upward through the silicone resin 70, the resin sheet 60 containing the light wavelength conversion material, and the silicone resin 80.

Figure 6:
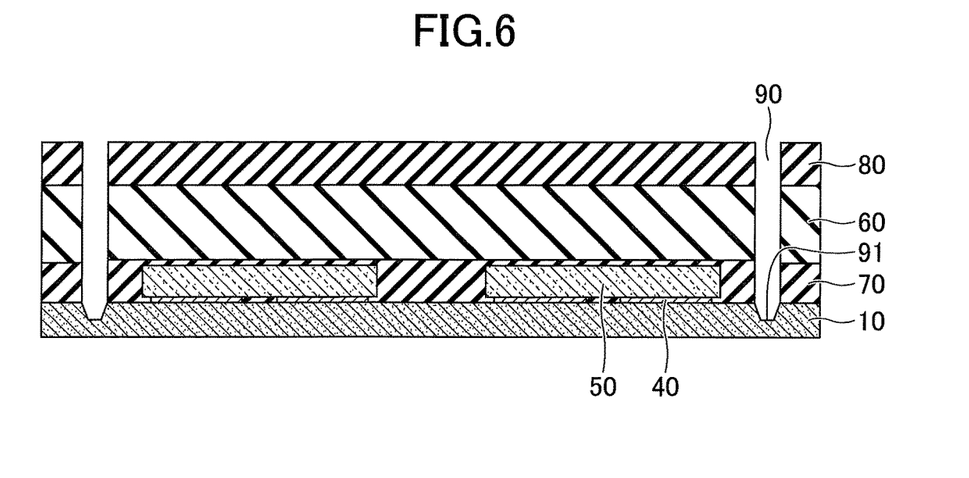
FIG. 6 is a diagram illustrating an example of a groove forming process of a method for manufacturing an optical module according to a first embodiment of the present invention.

FIG. 6 is a diagram illustrating an example of a groove forming process of the method for manufacturing the optical module according to the first embodiment of the present invention. In the groove forming process, a groove 90 is formed from the top surface of the silicone resin 80 to the printed circuit board 10 while passing through the resin sheet 60 containing the light wavelength conversion material and the silicone resin 70. The groove 90 does not penetrate the printed circuit board 10 but is formed at a depth where the groove 90 is formed in the printed circuit board 10, and the bottom surface 91 of the groove 90 is formed in the printed circuit board 10. Because forming the groove 90 up to the middle of the printed circuit board 10 (the substrate) is also referred to as a half-cut, the present process may be referred to as a half-cut process.

The groove 90 is formed so as to surround the LED chips 50. When multiple LED chips are mounted, a groove 90 is formed so as to surround the LED chips except a region between the LED chips. The groove 90 is formed near the outer periphery of the separated optical module 150, which will be described below. In FIG. 6, only a cross-section in one direction is illustrated, but the grooves 90 are formed at both ends in the direction perpendicular to the cutting direction of FIG. 6. That is, the groove 90 is formed into a rectangle so as to enclose the LED chips 50, and the groove 90 is formed so as to form a rectangular frame. If the LED chips 50 are to be circularly enclosed, a circular groove 90 may be formed around the LED chips 50. The following example illustrates an example in which the printed circuit board 10 has a rectangular shape in a plan view, and a groove 90 is formed along the outline of the printed circuit board 10 so as to enclose the LED chips 50 with a rectangular frame.

Figure 7:
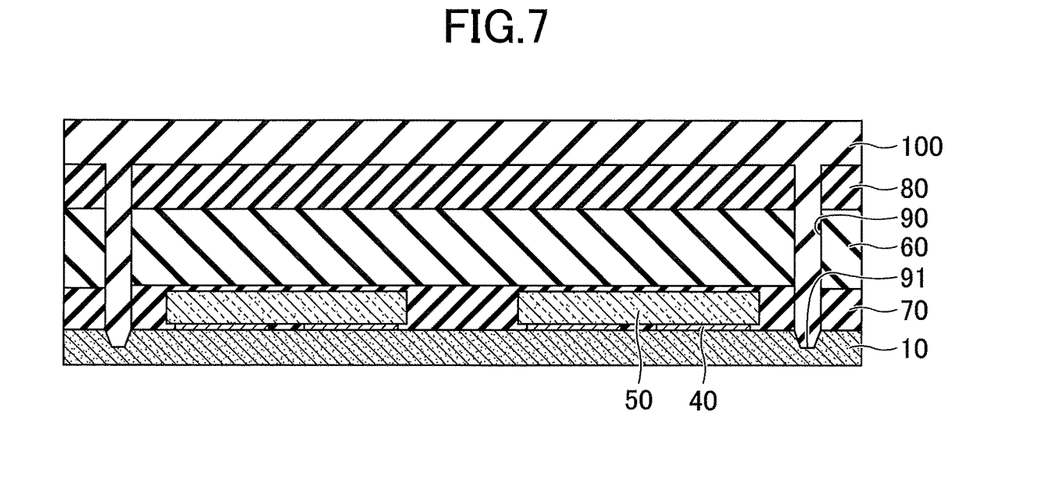
FIG. 7 is a diagram illustrating an example of an optical reflective resin sealing process of a method for manufacturing an optical module according to a first embodiment of the present invention.

FIG. 7 is a diagram illustrating an example of a light-reflective resin sealing process of the method for manufacturing the optical module according to the first embodiment of the present invention. In the light reflective resin sealing process, the groove 90 is filled with resin containing a light-reflective material. The resin containing the light-reflective material may be selected from a variety of resins, but in the present embodiment, an example of using white resin 100 as the light-reflective resin will be described. The white resin 100 can be properly used as the light-reflective resin because the white resin contains a light-reflective material. The white resin 100 filled in grooves 90 constitutes a reflector of the optical module.

The filling method of the white resin 100 is not particularly limited, and a compression mold method, a transfer mold method, a potting method, a printing method or the like may be properly used in the same manner as the coating process. The groove 90 is half-cut so as to reach the printed circuit board 10, thereby increasing the adhesive properties between the white resin 100 and the groove 90. That is, because a state of the white resin 100 reaching the middle of the printed circuit board 10 in the thickness direction is similar to a state of driving a pile into the ground, and because a contact area of the white resin 100 can be increased, high adhesive properties can be achieved.

When the white resin 100 is filled into the groove 90, the top surface of the silicone resin 80 may be covered with the white resin 100 as well as the grooves 90. Because it is usually difficult to fill only the grooves 90 with the white resin 100, the top surface of the silicone resin 80 may be also sealed with the white resin 100.

Figure 8:
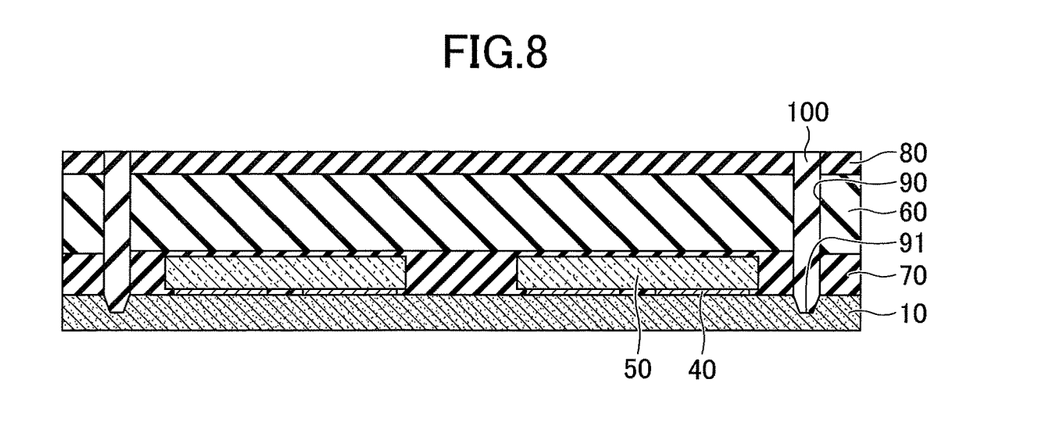
FIG. 8 is a diagram illustrating an example of a surface grinding process of a method for manufacturing an optical module according to a first embodiment of the present invention.

FIG. 8 is a diagram illustrating an example of a surface grinding process of the method for manufacturing the optical module according to the first embodiment of the present invention. In the surface grinding process, the top surface is ground until the silicone resin 80 is exposed. This removes unnecessary white resin 100 and forms an emitting surface of the optical module made of the transparent body (silicone resin 80). The surface grinding may be performed by various methods, and for example, the top surface of the white resin 100 may be removed by a grinding method.

Figure 9:
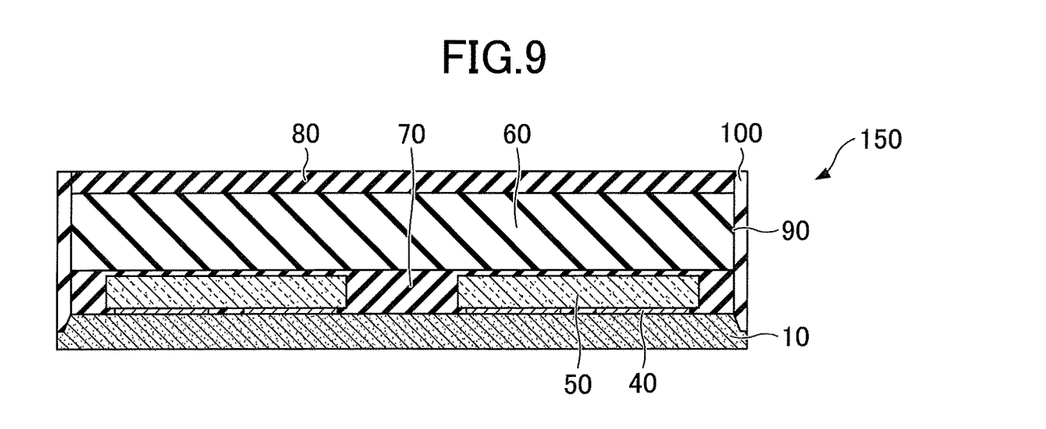
FIG. 9 is a diagram illustrating an example of a module separating process of a method for manufacturing an optical module according to a first embodiment of the present invention.

FIG. 9 is a diagram illustrating an example of a module separating process of the method for manufacturing the optical module according to the first embodiment of the present invention. In the module separating process, the optical module is separated by dicing along the groove 90 to leave a part of the white resin 100. By leaving the part of the white resin 100, the outer periphery of the separated optical module is covered with the white resin 100, and a reflector is famed on the outer periphery. Thus, light emitted from the LED chip 50 in a lateral face direction among the light emitted from the LED chip 50 can be reflected inward, thereby efficiently emitting light upward. When the module separating process is completed, the separated optical module 150 is completed.

Thus, according to the method for manufacturing the optical module according to the first embodiment, a low and downsized optical module can be manufactured in a small number of processes by mounting the LED chip 50 on the printed circuit board 10 using flip-chip mounting, sealing the space between the resin sheet 60 containing the light wavelength conversion material and the mounting surface of the printed circuit board 10 with the transparent resin, and coating the exposed surface of the resin sheet containing the light wavelength conversion material with the transparent resin. Further, by forming the groove 90 by half-cutting, the adhesive properties of the white resin 100 can be improved.

Figure 10:
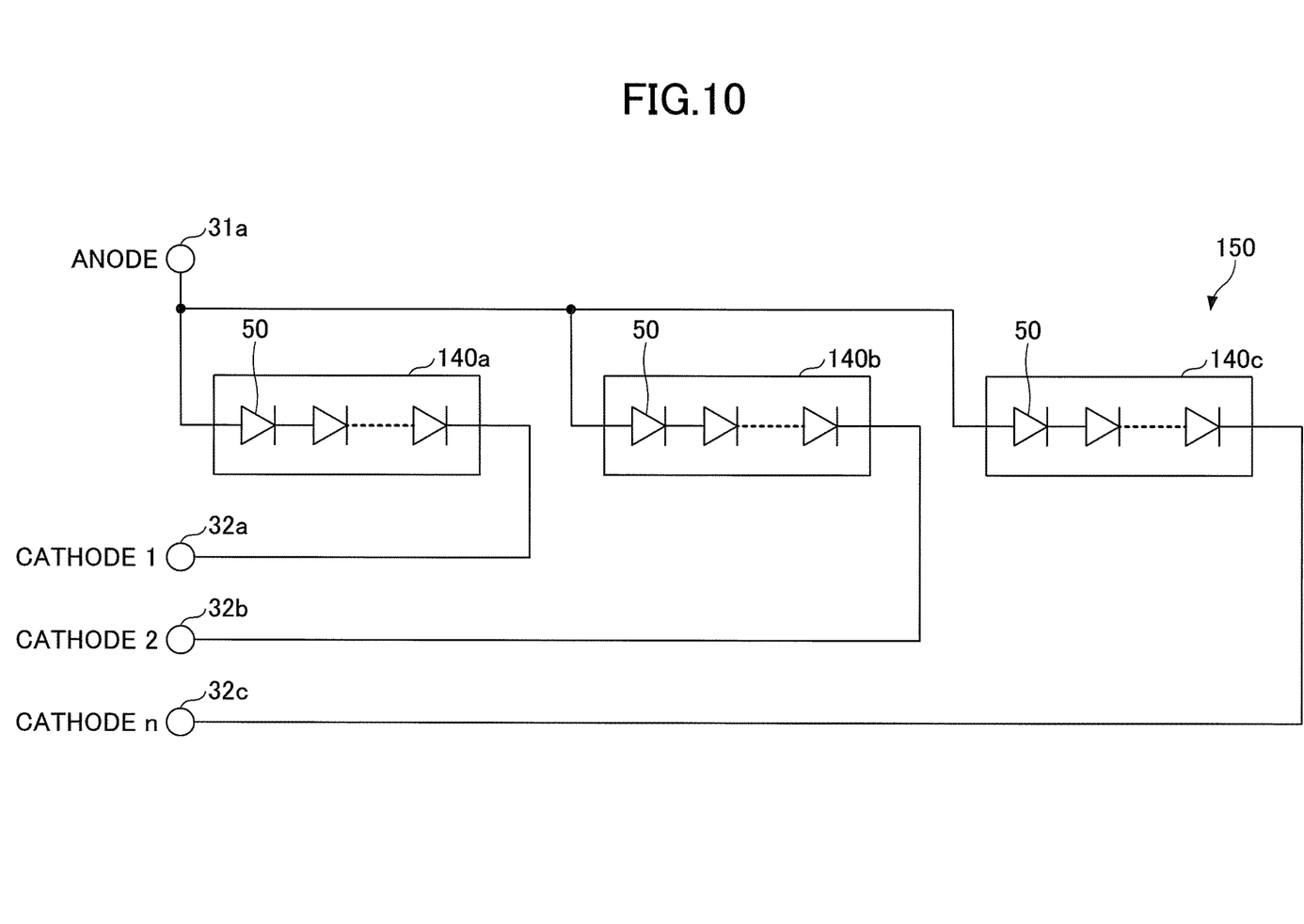
FIG. 10 is a diagram illustrating an example of a circuit configuration of an optical module according to a first embodiment of the present invention.

FIG. 10 is a diagram illustrating an example of a circuit configuration of an optical module according to a first embodiment of the present invention. In FIGS. 1 to 9, for convenience of explanation, an example in which two LED chips constitute one optical module 150 has been described.

However, when applying the optical module to a backlight unit or the like that illuminates a liquid crystal screen, the optical module 150 is formed by arranging a large number of LED chips 50.

In FIG. 10, three LED chip units (LED chip groups) 140a, 140b and 140c with multiple LED chips 50 connected in series are illustrated. Here, the entire assembly of LED chip units 140a, 140b and 140c corresponds to the optical module 150 illustrated in FIG. 9. Thus, although only two LED chips 50 are exemplified in FIGS. 1 to 9 for convenience, the optical module 150 is frequently configured to include typically more LED chips 50. Here, an example is described in which the optical module 150 includes three LED chip units 140a, 140b and 140c, and each of the LED chip units 140a, 140b and 140c includes a plurality of LED chips 50.

As illustrated in FIG. 10, each of the three LED chip units 140a, 140b and 140c has two terminals, which are an anode and a cathode. The anodes are then connected to a common external connection terminal 31a, and the cathodes are connected to different external connection terminals 32a, 32b and 32c, respectively.

When all of the LED chips 50 are connected in series, the voltage is divided into voltages in the series circuit, and therefore a high voltage must be applied to turn on all of the LED chips 50. Because providing such a power source is difficult in a practical product such as a smartphone, the LED chip units 140a, 140b and 140c, which are formed as a series circuit, are connected in parallel so that the all LED chips can be turned on at an applied voltage. By forming such a circuit configuration, the voltage required to turn on the all LED chips 50 is divided by LED chip units 140a, 140b, and 140c, and reduces the voltage required to turn on the LED chips 50 in each of the LED chip units 140a, 140b, and 140c.

Therefore, the number of LED chips 50 in a unit can be determined by the voltage that can be applied and the threshold voltage required to turn on the LED chips 50, and a large number of LED chips 50 can be turned on at the same time by providing a necessary number of the LED chip units 140a, 140b and 140c.

Figure 11:
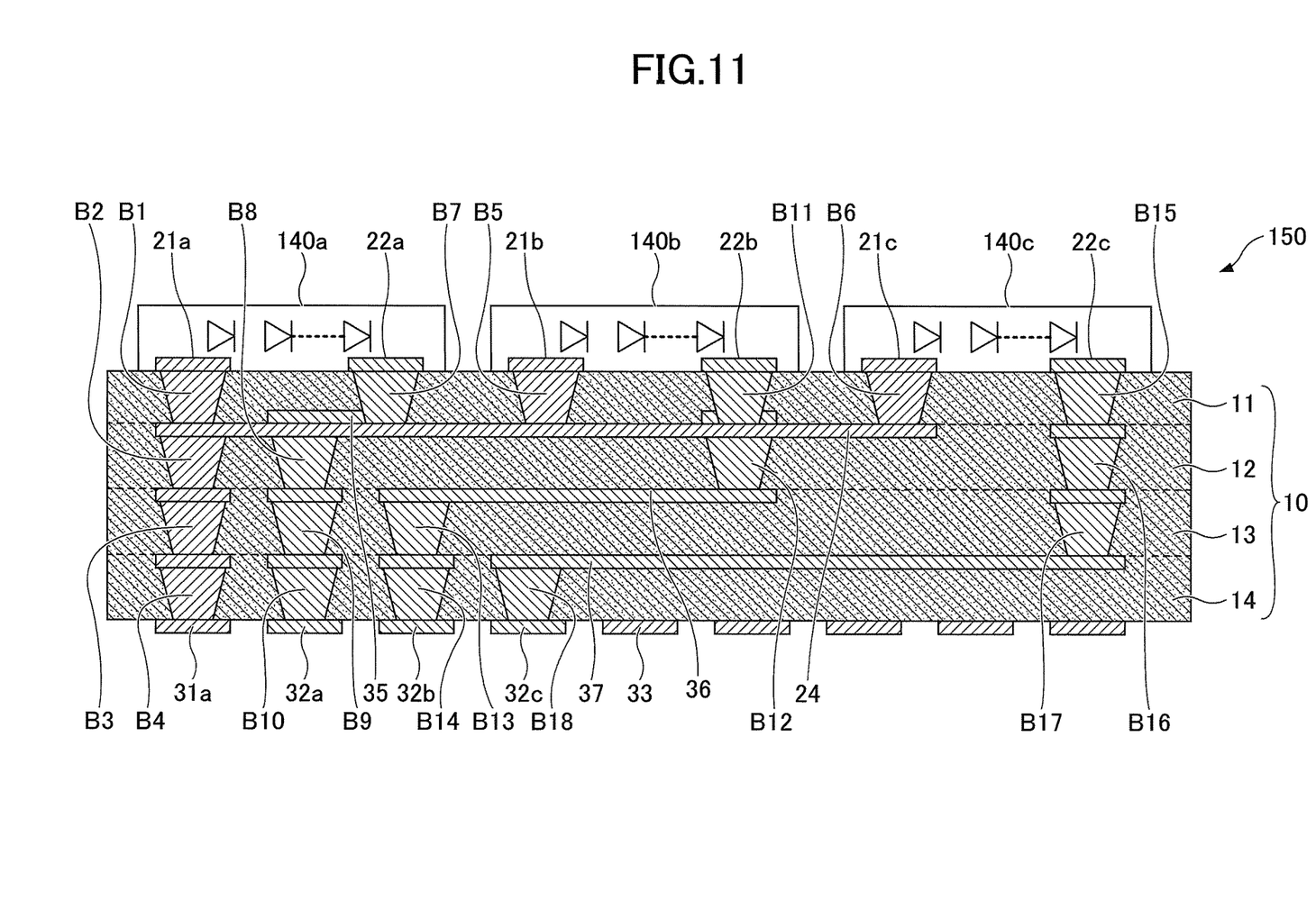
FIG. 11 is a diagram illustrating an example of an internal configuration of a printed wiring hoard of an optical module according to a first embodiment.

FIG. 11 is a diagram illustrating an example of an internal configuration of the printed circuit board 10 of the optical module 150 according to the first embodiment. The circuit configuration is the same as the circuit configuration in FIG. 10.

As illustrated in FIG. 11, the interior of the printed circuit board 10 is formed by a plurality of board layers 11, 12, 13 and 14 to form vias B1 to B18 that pass through each board layer, and interconnection layers 24, 35 to 37 along the board layers 11 to 14. The anodes of the LED chip units 140a, 140b and 140c are connected to the electrodes 21a, 21b and 21c, respectively, and are commonly connected to the external connection terminals 31a by way of vias B1, B5 and B6 of the board layer 11 and the interconnection layer 24, and vias B2, B3 and B4 penetrating through the board layers 12 to 14.

Meanwhile, the cathode of the LED chip unit 140a is connected to the external connection terminal 32a by way of the electrode 22a, the via B7 penetrating through the board layer 11 that is the top layer, the interconnection layer 35 between the board layers 11 and 12, and vias B8, B9 and B10 penetrating through the board layers 12 to 14. Also, the cathode of the LED chip unit 140b is connected to the external connection terminal 32b by way of the electrode 22b, vias B11 and B12 penetrating through the top and second board layers 11 and 12, the interconnection layer 36 between the board layers 12 and 13, and vias B13 and B14 penetrating through the board layers 13 and 14. Furthermore, the cathode of the LED chip unit 140c is connected to the external connection terminal 32c by way of the electrode 22c, vias B15, B16 and B17 penetrating through the top to third board layers 11, 12 and 13, the interconnection layer 37 between the board layers 13 and 14, and a via B18 penetrating through the board layer 14. Thus, in the interconnections of the cathodes of the LED chip units 140a to 140c, each of the interconnections is independently formed and connected to the external connection terminals 32a to 32c by utilizing the step difference of the board layers 11 to 14. By taking such a configuration, a plurality of interconnection paths can be provided within the printed circuit board 10 to achieve a reduction in size of the optical module.

Here, the external connection terminals 31a, 32a and 32c are formed close to each other at the end of the printed circuit board 10. This is to facilitate the power supply, and to enable the power supply from a single location.

In contrast, the external connection terminals 31a, 32a to 32c are preferably formed dispersedly and uniformly on the back surface of the printed circuit board 10 in order to prevent a local warpage. Thus, if necessary, a dummy external connection terminal 33 to which no interconnection is connected may be provided. Thus, even if heat is generated by the optical module 150, the stress generated in the printed circuit board 10 can be made uniform, and the local warpage and the like can be prevented.

From a similar viewpoint, a dummy via that is not filled with a metallic material may be formed as necessary. That is, similarly to vias B1 to B4 and vias B8 to B10, vias penetrating through predetermined board layers 11 to 14 may be formed in locations that do not interfere with the interconnections, and the vias may be made uniform.

In FIG. 10 and FIG. 11, although an example of forming the anodes commonly and the cathodes independently is described, a configuration of forming cathodes commonly and anodes independently may be formed. Whether to form either of the anode or the cathode as a common terminal may be set depending on the intended use.

Figure 12:
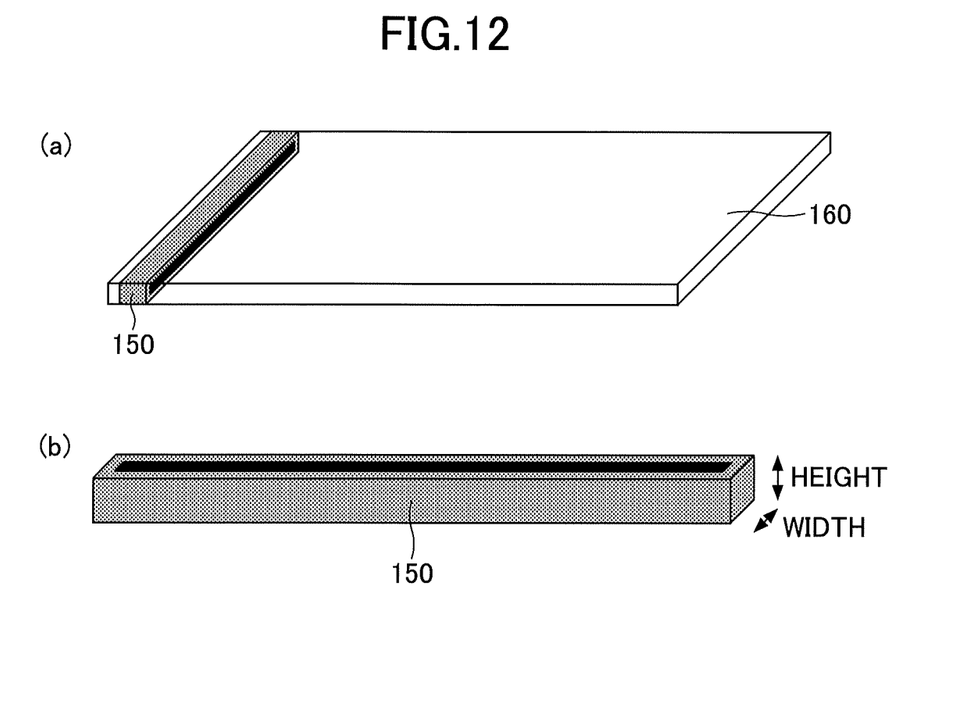
FIG. 12(a) and FIG. 12(b) are diagrams illustrating an example of applying an optical module according to a first embodiment to a backlight unit.

FIG. 12 is a diagram illustrating an example in which the optical module 150 according to the first embodiment is applied to the backlight unit 160. FIG. 12(a) is a diagram illustrating an example of a configuration in which an optical module 150 is incorporated into a backlight unit 160, and FIG. 12(b) is a diagram illustrating an extracted optical module 150 from a backlight module 160 that incorporates the optical module 150.

As illustrated in FIG. 12(a), the optical module 150 is provided at one end of the backlight 160 in the lengthwise direction along a short side of one of the contours of the backlight 160. The light emitting surface faces laterally along the surface of the backlight 160.

As illustrated in FIGS. 12(a) and (b), because the width of the optical module 150 affects the height of the backlight unit 160 when incorporated into the backlight unit 160, decreasing the width is required. Also, since the height of the optical module 150 affects an area of the surface of the backlight unit 160, decreasing the height of the optical module 150 is required.

Thus, the optical module 150 is required to be downsized in both height and width. According to the optical module and the method for manufacturing the same of the present embodiment, a low-height optical module 150 can be manufactured and be formed, which can satisfy such requirements.

As illustrated in FIGS. 11 and 12, when the printed circuit board 10 has a rectangular shape in a plan view, the optical module 150 appropriate for the backlight unit 160 can be configured by disposing the LED chip units 140a, 140b and 140c along the lengthwise direction of the rectangular.

Second Embodiment

Figure 13:
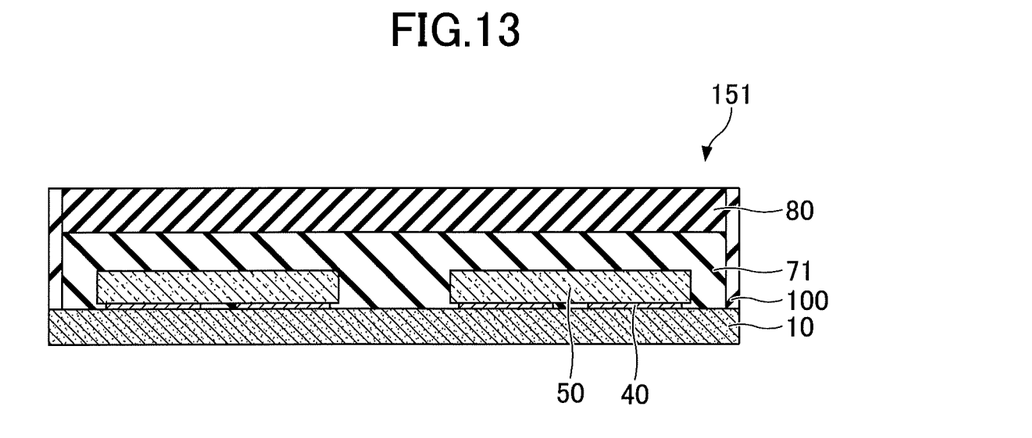
FIG. 13 is a diagram illustrating an example of a method for manufacturing an optical module according to a second embodiment of the present invention.

FIG. 13 is a diagram illustrating an example of a method for manufacturing an optical module according to a second embodiment of the present invention. The sealing process of the method for manufacturing the optical module according to the second embodiment differs from that of the method for manufacturing the optical module according to the first embodiment.

The method for manufacturing the optical module according to the second embodiment seals the top surface of the printed circuit board 10 including the LED chip 50 in the sealing process, using silicone resin 71 mixed with a light wavelength conversion material. The optical module 151 can be reduced in height by sealing the side, top and bottom surfaces of the LED chips 50 with the silicone resin 71 mixed with a light wavelength conversion material. Because the silicone resin 71 mixed with the light wavelength conversion material has the light wavelength conversion function and is transparent, the function of the optical module 151 can be properly implemented.

The transparent resin coating process is different from that of the first embodiment in that the object to be coated with the silicone resin 80 is the resin sheet 60 containing the light wavelength conversion material or the silicone resin 71 mixed with the light wavelength conversion material, and the process itself is the same as that of the first embodiment. Because the other processes are similar to those of the first embodiment, the description thereof is not repeated. In this case, silicone resins used as the silicone resin 71 and the silicone resin 80 are naturally different from each other.

Moreover, the optical module 151 according to the second embodiment differs from the optical module 150 according to the first embodiment in that the individual resin sheet 60 containing the wavelength conversion material and the silicone resin 70 are not present, and that the silicone resin 71 containing the light wavelength conversion material is provided instead. Because the other configurations are similar to those of the first embodiment, the description thereof is not repeated.

According to the method for manufacturing the optical module 151 and the optical module 151 of the second embodiment, the number of processes and components can be further reduced, and further shortening the processes and the height can be achieved.

Third Embodiment

Figure 14:
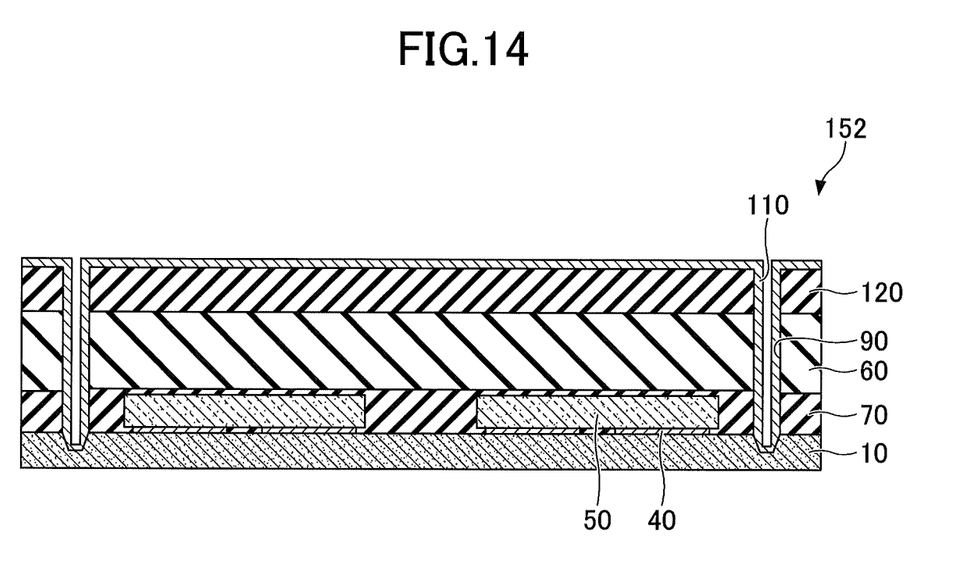
FIG. 14 is a diagram illustrating an example of a method for manufacturing an optical module according to a third embodiment of the present invention.

FIG. 14 is a diagram illustrating an example of a method for manufacturing an optical module according to a third embodiment of the present invention. The method for manufacturing an optical module 152 according to the third embodiment differs from the method of manufacturing the optical modules 150, 151 according to the first and second embodiments in that the method further includes an inorganic layer forming process between a groove forming process and a light-reflective resin sealing process. In the inorganic layer forming process, after a groove 90 is formed in the groove forming process, an inorganic layer 110 is formed on the inner surface of the groove 90. The inorganic layer 110 may be made of a metallic material such as aluminum and copper having high optical reflectivity. The inorganic material serves to improve the light-reflective efficiency of the white resin 100 containing the light-reflective material, and can block moisture and reduce moisture absorption.

Because the other processes are similar to those of the method for manufacturing the first and second optical modules 150, 151, the description is omitted. The method for manufacturing the optical module 152 according to the third embodiment is applicable to any of the method for manufacturing the first and second optical modules 150 and 151.

The optical module 152 according to the third embodiment is similar to the optical modules 150, 151 according to the first and second embodiments except that the inorganic layer 110 covering the outer peripheral lateral face of the sealing body 120 is further provided between the outer peripheral lateral face of the sealing body 120 constituted of a stack comprised of the printed circuit board 10, the LED chips 50, the resin sheet 60 containing the light wavelength conversion material, the silicone resin 70 or the silicone resin 71, and the silicone resins 80, and the white resin 100. Accordingly, the description thereof is omitted.

According to the method for manufacturing the optical module 152 and the optical module 152 of the third embodiment, the optical reflection efficiency of the white resin 100 can be improved and the moisture absorption of the optical module 152 can be reduced.

Although the preferred embodiments of the invention have been described in detail above, the invention is not limited to the embodiments described above, and various modifications and alternations can be made to the embodiments described above without departing from the scope of the claims.

The present application claims priority to Priority Application No. 2017-049732, filed on Mar. 15, 2017 with the Japan Patent Office, the entire contents of which are incorporated herein by reference.

DESCRIPTION OF THE REFERENCE NUMERALS 10 printed circuit board
11 to 14 board layer
20, 21a to 21c, 22a to 22c electrodes
24, 35, 36, 37 interconnection layer
30, 31a, 32a-32c, 33 external connection terminal
40 bonding paste
50 LED chip
60 resin sheet containing a light wavelength conversion material
70, 71, 80 silicone resin
90 groove
100 white resin
110 inorganic layer
140a to 140c LED chip unit
150, 151, 152 optical module
160 backlight units
B1 to B18 vias

The invention claimed is:

1. A method for manufacturing an optical module, comprising:
   a step of mounting a light emitting device on a board having a plurality of electrodes on its surface in a facedown manner;
   a step of disposing a resin sheet containing a light conversion material so as to face a light emitting device mounting surface of the board, and filling a space between the resin sheet and the board including the resin sheet and the light emitting device with a first light transmissive resin;
   a step of covering a surface of the resin sheet opposite to a surface of the resin sheet covered with the first light transmissive resin, with a second light transmissive resin;
   a step of forming a groove extending from a top surface of the second light transmissive resin to a predetermined depth of the board;
   a step of filling the groove with light reflective resin and covering the top surface of the second light transmissive resin with the light reflective resin;
   a step of removing the light reflective resin on the second light transmissive resin, and
   a step of dicing the light emitting device b cutting along the light reflective resin such that an outer lateral surface is covered with the light reflective resin by leaving part of the light reflective resin filled in the groove.

2. The method for manufacturing the optical module as claimed in claim 1, further comprising:
   a step of forming a layer made of an inorganic film on a surface of the groove between the step of forming the groove and the step of filling the groove with the light reflective resin.

3. A method for manufacturing an optical module, comprising:
   a step of mounting a light emitting device on a board having a plurality of electrodes on its surface in a facedown manner;
   a step of sealing the surface of the board including lateral faces, a top face, and a lower face of the light emitting device with a first light transmissive resin mixed with a light wavelength conversion material;
   a step of covering a top surface of the first light transmissive resin with a second light transmissive resin;
   a step of forming a groove extending from a top surface of the second light transmissive resin to a predetermined depth of the board;
   a step of filling the groove with light reflective resin and covering an entire top surface of the second light transmissive resin with the light reflective resin;
   a step of removing the light reflective resin on the entire top surface of the second light transmissive resin; and
   a step of dicing the light emitting device by cutting along the light reflective resin such that outer peripheral lateral surface is covered with the light reflective resin by leaving part of the light reflective resin filled in the groove.

4. A method for manufacturing an optical module, comprising:
   a step of mounting a light emitting device on a board having a plurality of electrodes on its surface in a facedown manner;
   a step of sealing the surface of the board including lateral faces, a top face, and a lower face of the light emitting device with a first light transmissive resin mixed with a light wavelength conversion material;
   a step of covering a top surface of the first light transmissive resin with a second light transmissive resin;
   a step of forming a groove extending from a top surface of the second light transmissive resin to a predetermined depth of the board;
   a step of forming a layer made of an inorganic film on a surface of the groove;
   a step of filling the groove with light reflective resin and covering the top surface of the second light transmissive resin with the light reflective resin;
   a step of removing the light reflective resin on the second light transmissive resin; and
   a step of dicing the light emitting device by cutting along the light reflective resin such that outer peripheral lateral surface is covered with the light reflective resin by leaving part of the light reflective resin filled in the groove.

5. An optical module, comprising:
   a board having a plurality of electrodes on its surface;
   a light emitting device mounted on the plurality of electrodes of the board in a facedown manner;
   a resin sheet containing a light wavelength conversion material provided above the light emitting device;
   a first light transmissive resin sealing a space between the board and the resin sheet including a space between the light emitting device and the resin sheet;
   a second light transmissive resin covering a face of the resin sheet opposite to the face of the resin sheet sealed with the first light transmissive resin; and
   a light reflective resin containing a light reflective material provided to cover an outer peripheral lateral surface along the outer peripheral lateral surface of a stack constituted of the board, the light emitting device, the resin sheet, the first light transmissive resin and the second light transmissive resin.

6. The optical module as claimed in claim 5, further comprising:
a layer made of an inorganic film between the outer peripheral lateral surface of the stack and the light reflective resin.

7. The optical module as claimed in claim 5,
wherein the board has a rectangular shape in a plan view,
wherein a plurality of light emitting devices is mounted along a lengthwise direction of the rectangular shape,
wherein the plurality of light emitting devices includes a plurality of groups of light emitting devices including a predetermined number of light emitting devices connected in series, and
wherein a back surface of the board includes a plurality of external connection terminals to be electrically connected with a motherboard.

8. The optical module as claimed in claim 7,
wherein each the plurality of light emitting groups includes two terminals,
wherein one terminal of the each of the plurality of light emitting groups is commonly connected to one of the plurality of external connection terminals, and
wherein the other terminal of the each of the plurality of light emitting groups is connected to different one of the plurality of external connection terminals.

9. The optical terminal as claimed in claim 8,
wherein the board includes a plurality of layers, and
wherein the other terminal of the each of the plurality of light emitting groups is connected to the different one of the plurality of external connection terminals via interconnections provided in different layers of the board.

10. An optical module, comprising:
a board having a plurality of electrodes on its surface;
a light emitting device mounted on the plurality of electrodes of the board in a facedown manner;
a first light transmissive resin mixed with a light wavelength conversion material and sealing the surface of the board including the light emitting device;
a second light transmissive resin covering a top surface of the first light transmissive resin;
a light reflective resin containing a light reflective material provided to cover an outer peripheral lateral surface along the outer peripheral lateral surface of a stack constituted of the board, the light emitting device, the first light transmissive resin and the second light transmissive resin; and
a layer made of an inorganic film between the outer peripheral lateral surface of the stack and the light reflective resin.

11. The optical module as claimed in claim 10,
wherein the board has a rectangular shape in a plan view,
wherein a plurality of light emitting devices is mounted along a lengthwise direction of the rectangular shape,
wherein the plurality of light emitting devices includes a plurality of groups of light emitting devices including a predetermined number of light emitting devices connected in series, and
wherein a back surface of the board includes a plurality of external connection terminals to be electrically connected with a motherboard.

12. An optical module, comprising:
a board having a rectangular shape in a plan view and including a plurality of electrodes on its top surface and a plurality of external connection terminals on its back surface;
a plurality of light emitting devices mounted on the plurality of electrodes of the board along a lengthwise direction of the rectangular shape in a facedown manner; and
a light transmissive resin sealing the top surface of the board including the plurality of light emitting devices,
wherein the plurality of light emitting devices includes a plurality of groups of a predetermined number of light emitting devices electrically connected in series.

* * * * *